United States Patent
Suzuki

(10) Patent No.: US 7,376,033 B2
(45) Date of Patent: May 20, 2008

(54) SEMICONDUCTOR DEVICE AND PROGRAMMING METHOD THEREFOR

(75) Inventor: Seiichi Suzuki, Aizuwakamatsu (JP)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/443,640

(22) Filed: May 30, 2006

(65) Prior Publication Data

US 2006/0279986 A1   Dec. 14, 2006

Related U.S. Application Data

(63) Continuation of application No. PCT/JP2005/009881, filed on May 30, 2005.

(51) Int. Cl.
  *G11C 7/02*   (2006.01)
  *G11C 16/06*   (2006.01)

(52) U.S. Cl. .................... 365/210; 365/51; 365/185.2

(58) Field of Classification Search ............... 365/210
See application file for complete search history.

(56) References Cited

U.S. PATENT DOCUMENTS

| | | | | |
|---|---|---|---|---|
| 5,214,604 | A * | 5/1993 | Kato | 365/185.2 |
| 5,754,475 | A * | 5/1998 | Bill et al. | 365/185.25 |
| 5,946,241 | A * | 8/1999 | Zink et al. | 365/189.01 |
| 6,118,702 | A * | 9/2000 | Shieh et al. | 365/185.21 |
| 6,456,533 | B1 | 9/2002 | Hamilton et al. | |
| 6,870,777 | B2 | 3/2005 | Maki | |
| 6,906,951 | B2 * | 6/2005 | Wong | 365/185.03 |
| 7,035,149 | B2 * | 4/2006 | Shimizu | 365/191 |
| 7,099,188 | B1 * | 8/2006 | Wong | 365/185.03 |
| 2001/0048610 | A1 * | 12/2001 | Homma et al. | 365/185.2 |
| 2003/0112664 | A1 | 6/2003 | Yamano | |
| 2004/0095824 | A1 * | 5/2004 | Kurumada et al. | 365/205 |
| 2005/0073885 | A1 * | 4/2005 | Suzuki et al. | 365/185.2 |

FOREIGN PATENT DOCUMENTS

| | | |
|---|---|---|
| EP | 1321945 | 6/2003 |
| JP | 04011392 | 1/1992 |
| JP | 9270195 | 10/1997 |
| JP | 10011985 | 1/1998 |
| JP | 2000200494 | 7/2000 |
| JP | 2001244983 | 9/2001 |
| JP | 2003007055 | 1/2003 |
| JP | 2003187587 | 7/2003 |
| JP | 2004529448 T | 9/2004 |
| WO | WO02071410 | 9/2002 |

* cited by examiner

*Primary Examiner*—Son L. Mai
(74) *Attorney, Agent, or Firm*—Ingrassia Fisher & Lorenz, P.C.

(57) ABSTRACT

There is provided a semiconductor device including regular cells (16) disposed in a regular sector (10) and connected to a word line (14), and a plurality of reference cells (26) used in reading data from the regular cells (10), wherein one of the reference cells is selected based on a word line distance associated with a regular cell (16) from which data is read. In accordance with the present invention, it is possible to reduce the difference in delay times in the outputs to the sensing amplifier (30) from the regular cell (16) and the reference cell (26), by selecting one of a plurality of reference cells (26) in response to the word line distance of the regular cell from which data is read. It is therefore possible to provide a semiconductor device in which the chip area can be reduced and the sensing operation can be accelerated.

19 Claims, 8 Drawing Sheets

SEMICONDUCTOR DEVICE AND PROGRAMMING METHOD THEREFOR

CROSS-REFERENCES TO RELATED APPLICATIONS

This is a continuation of International Application No. PCT/JP2005/009881, filed May 30, 2005 which was not published in English under PCT Article 21(2).

BACKGROUND OF THE INVENTION

1. Field of the Invention

This invention relates generally to semiconductors, and more particularly, to a semiconductor device having a semiconductor memory.

2. Description of the Related Art

Some semiconductor memory devices compare data in a reference cell and data in a regular cell to read the data from the regular cell. Referring to FIG. 1, a flash memory will be described as an example of such a semiconductor memory device.

FIG. 1 is a block diagram of memory cells and periphery circuitry therefor in accordance with a conventional flash memory. A regular sector 10 includes regular cells 16. Regular cells 16a, 16b, and 16c of the regular cells 16 are respectively connected by word lines 14a, 14b, and 14c and bit lines 18. The word lines 14a, 14b, and 14c are connected to a word driver 12. The bit lines 18 are connected to a sensing amplifier 30. A reference cell 26 is disposed in a reference sector 20. The reference cell 26 is connected by a word line 24 and a connection line 32. The word line 24 is connected to a reference word driver 22 and the connection line 32 is connected to the sensing amplifier 30.

Data reading is described with the regular cell 16a serving as an example. The word driver 12 selects the word line 14a connected to the regular cell 16a. The bit line 18 connected to the regular cell 16a is then selected. The sensing amplifier 30 compares the threshold voltage of the regular cell 16a and that of the reference cell 26. This accomplishes reading of the regular cell 16a to learn whether the regular cell 16a represents "0" or "11".

Each of the regular cells 16 has a "word line distance" which is a distance along each of word lines 14 from the word driver 12 to each of the regular cells 16. Similarly, each of the reference cells 26 has a "reference word line distance" which is a distance along each of the reference word lines from the reference word driver 22 to each of the reference cells 26.

As an example of a semiconductor memory device having multiple reference cells, Japanese Patent Application Publication 9-270195 discloses a semiconductor device that includes multiple reference cells having different resistances and capacitances in their wirings to the sensing amplifier. Japanese Patent Application Publication 10-11985 discloses a semiconductor device having a reference cell arranged close to the regular cell.

In accordance with conventional techniques, the word driver 12 is located on one side of the regular sector 10 in order to reduce a chip area. Such reduced chip area increases the number of the regular cells 16 connected to each of the word lines 14. Accordingly, when the chip area is reduced, the word line 14 becomes longer. This causes several shortcomings. Referring to FIG. 1 again, the regular cells 16a, 16b, and, 16c have different word line distances La, Lb, and, Lc, respectively. As the word line 14 lengthens, differences become greater between the word line distances La, Lb, and, Lc. This increases the differences in the resistances and capacitances of the word lines 14 applied to the regular cells 16. Consequently, this will cause different delay times in outputs to the sensing amplifier 30 from the regular cells 16a, 16b, and 16c.

For example, when there the delay time of the output from the reference cell 26 to the sensing amplifier 30 is configured almost equal to that of the delay time from the regular cell 16b to the sensing amplifier 30, the delay time from the regular cell 16a to the sensing amplifier 30 is shorter than the delay time from the reference cell 26 to the sensing amplifier 30. On the other hand, the delay time from the regular cell 16c to the sensing amplifier 30 is longer than the delay time from the reference cell 26 to the sensing amplifier 30. If the delay time varies depending on the regular cells 16 in this manner, there will be no operation margin in the sensing amplifier 30 and the sensing amplifier 30 will operate unstably. In order to prevent the afore-described shortcomings, a limitation is set on the number of regular cells connected to the word line 14. Alternatively, the operating time of the sensing amplifier 30 must necessarily be lengthened. In other words, it is difficult to realize both reduction of the chip area and speeding up of the sensing operation.

SUMMARY OF THE INVENTION

It is therefore an object of the preset invention to provide a semiconductor device where it is possible to reduce a difference of a delay time in outputs to a sensing amplifier between from regular cells and from reference cells, thereby reducing chip area and speeding up sensing operations.

According to a first aspect of the present invention, there is preferably provided a semiconductor device including regular cells disposed in a regular sector and connected to a word line and a plurality of reference cells used in reading data from the regular cells, wherein one of the reference cells is selected based on a word line distance associated with a regular cell from which data is read. In accordance with the present invention, it is possible to reduce the difference in delay time of outputs to the sensing amplifier from the regular cell and from the reference cell by selecting one of a plurality of reference cells in response to the word line distance of the regular cell from which data is read. Thus, it is possible to provide a semiconductor device in which the chip area can be reduced and the sensing operation can be accelerated.

The above-mentioned semiconductor device may further include a reference word line connected to the reference cells, wherein each of the reference cells has a different reference word line distance from each other. In accordance with the present invention, it is possible to select the reference cell having A reference word line distance that corresponds to the word line distance to enable reduction of the difference between the delay times of the outputs to the sensing amplifier between from the regular cell and from the reference cell.

The above-mentioned semiconductor device may further include a reference word driver driving the reference word line and a word driver driving the word line, wherein the reference word driver is adjacent to the word driver. In accordance with the present invention, the reference word driver and the word driver can be disposed close to a booster circuit to enable output to the regular cell and to the reference cell at almost equal timings. It is therefore possible to further reduce the difference between the delays from the regular cell to the sensing amplifier and from the reference cell to the sensing amplifier.

According to another aspect of the present invention, there is preferably provided a semiconductor device including regular cells disposed in a regular sector and connected to a word line, a reference cell used for reading data from the regular cells, a reference word line connected to reference cells, and a dummy word line located along the reference word line. In accordance with the present invention, by providing a dummy word line adjacent to the reference word line, parasitic capacitance corresponding to that between adjacent word lines in the regular sector can be approximated between the dummy word line and the reference word line. In this manner, the capacitance applied to the reference word line approximates the capacitance of the word line, making it possible to reduce the difference between delay times of the outputs to the sensing amplifier between from the regular cell and from the reference cell. Accordingly, it is possible to provide a semiconductor device in which the chip area can be reduced and the sensing operation can be accelerated.

In the above-mentioned semiconductor, the dummy word line may be connected to a constant voltage source such that the capacitance applied to the reference word line can approximate that of the word line. Further, the spacing between the reference word line and the dummy word line may be substantially equal to that between adjacent word lines in the sector such that the capacitance applied to the reference word line further approximates that of the word line.

DESCRIPTION OF THE PREFERRED EMBODIMENTS

A description will now be given, with reference to the accompanying drawings, of embodiments of the present invention.

First Embodiment

Figure 1:
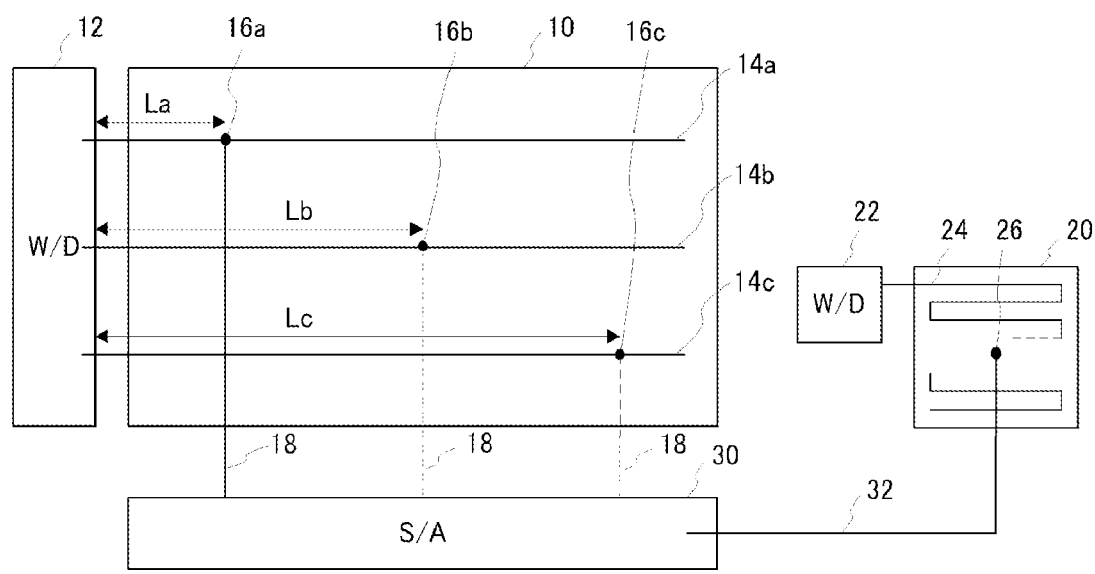
FIG. 1 is a block diagram illustrating a regular sector and periphery circuitry therefor in a conventional flash memory.
Figure 2A:
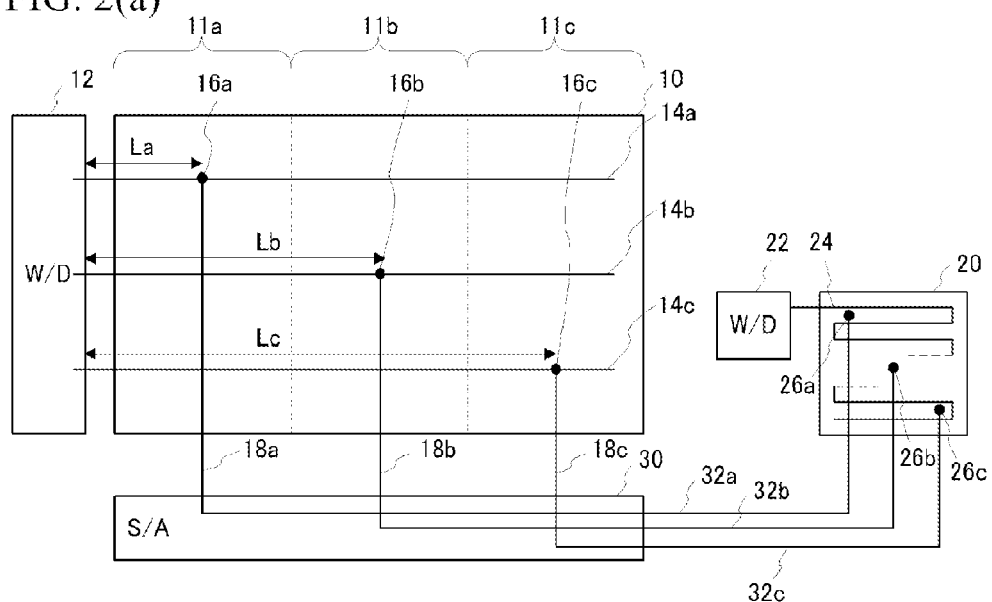
FIG. 2(a) is a block diagram illustrating a regular cell and periphery thereof in a flash memory in accordance with a first embodiment of the present invention.
Figure 2B:
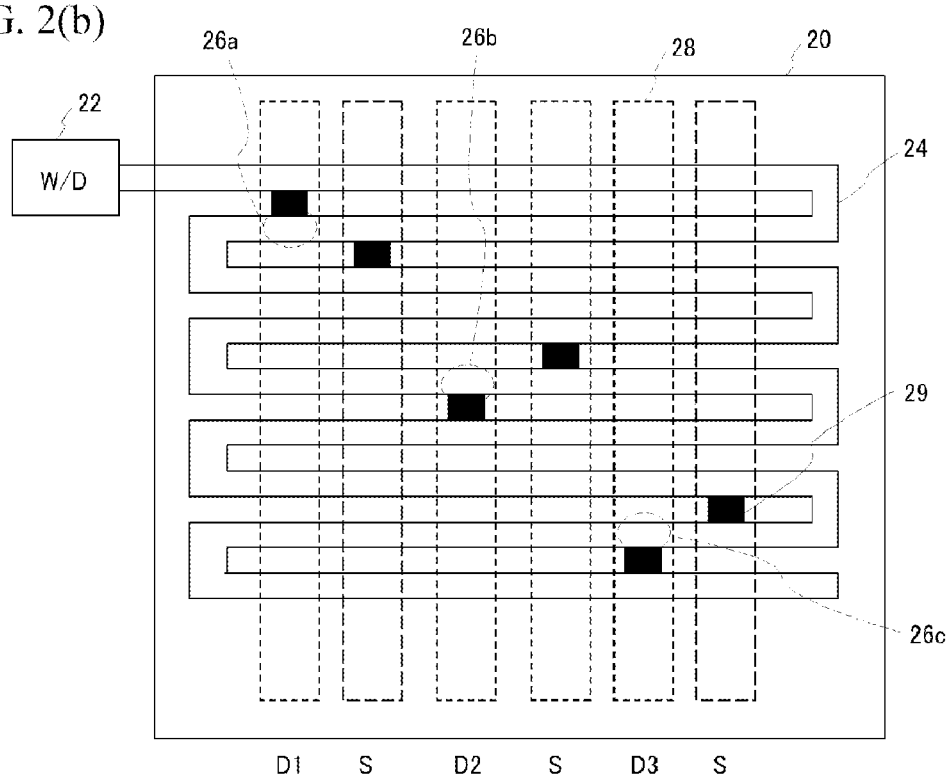
FIG. 2(b) is a block diagram of a reference sector and periphery thereof in the flash memory in accordance with the first embodiment of the present invention.

FIG. 2(a) is a block diagram of a regular sector and periphery thereof in a flash memory in accordance with a first embodiment of the present invention. FIG. 2(b) shows a reference sector thereof. A regular sector 10 is divided into sub-sectors 11a, 11b, and 11c. Regular cells 16a, 16b, and 16c are respectively disposed in the sub-sectors 11a, 11b, and 11c. The regular cells 16a, 16b, and 16c are connected by word lines 14a, 14b, and 14c, which are connected to a word driver 12. The word lines 14a, 14b, and 14c are also respectively connected to bit lines 18a, 18b, and 18c, which are connected to a sensing amplifier 30.

The word driver 12 drives the word lines 14 connected to the regular cells 16, for data programming, data erasing, and data reading. The sensing amplifier 30 selects one of the bit lines 18 connected to one of the regular cells 16 when data programming, data erasing, and data reading is performed. Also, the sensing amplifier 30 compares data read from the regular cell 16 and one of reference cells 26.

Reference cells 26a, 26b, and 26c are disposed in a reference sector 20. The reference cells 26a, 26b, and 26c are used for reading data from the regular cells 16. A reference word line 24 is connected to a reference word driver 22, and has a rectangular waved shape as shown in more detail in FIG. 2(b). The reference cells 26a, 26b, and 26c are connected to the reference word line 24. The reference cells 26a, 26b, and 26c, therefore, have different reference word line distances.

The reference cells 26a, 26b, and 26c are connected by connection lines 32a, 32b, and 32c, which are connected to the sensing amplifier 30. More specifically, as shown in FIG. 2(b), S and D1 are connection regions 28 that are connected to the reference cell 26a via a contact portion 29. The connection regions 28 are connected to a source region and a drain region of a transistor used for the reference cell 26a. That is to say, the connection line 32a is coupled to the reference cell 26a via the connection regions S and D1. The reference cells 26b and 26c are configured in a similar manner.

Figure 3:
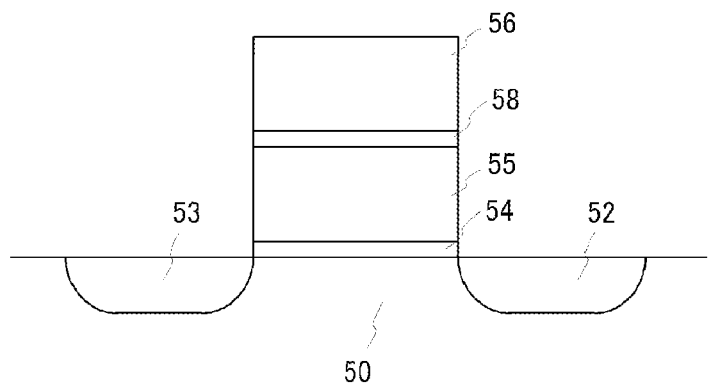
FIG. 3 is a cross-sectional view illustrating a width direction of a word line in a cell transistor used for a regular cell and a reference cell in the flash memory in accordance with the first embodiment of the present invention.

FIG. 3 is a cross-sectional view illustrating a width direction of the word line in a cell transistor used for the regular cell 16 and the reference cell 26 in accordance with this first embodiment of the present invention. An N-type drain region 52 and an N-type source region 53 are formed in a P-type silicon semiconductor substrate 50 (or in a P-type region of a semiconductor substrate). A tunnel oxide film 54 (silicon oxide film) is provided on the semiconductor substrate 50. A floating gate 55 is provided on the tunnel oxide film 54 as a charge storage layer. An insulating film 58 is provided on the floating gate 55, and a word line 56 that also serves as a control gate is provided thereon. By storing charge in the floating gate 55, this transistor functions as a non-volatile memory cell.

To write data into the regular cell 16, a positive voltage is respectively supplied to the word line 56 and the drain region 52 to flow current across the regular cell 16. At this time, such supplied voltage generates hot electrons (electrons having high energy). Data is written into the regular cell 16, by injecting the hot electrons into floating gate 55, the charge storage layer. The threshold voltage of the transistor can be adjusted by adjusting the voltage and pulse width supplied. To erase data from the regular cell 16, a negative voltage is supplied to the word line 56 and a positive voltage is supplied to the semiconductor substrate 50. This extracts electrons into the semiconductor substrate 50, the electrons having been injected into the charge storage layer (i.e., floating gate) 55. It is thus possible to decrease the threshold voltage of the transistor.

To read data from the regular cell 16, a given voltage is supplied to the word line 56, the source region 53 is grounded, and a positive voltage is supplied to the drain region 52. The current flowing between the source region 53 and the drain region 52 varies depending on the threshold voltage. Therefore, the sensing amplifier 30 compares the current flowing therebetween with the current flowing across the reference cell 26 to determine whether the data is "0" or "1". In this manner, data is read from the regular cell 16.

In accordance with the present invention, one of the reference cells 26 is selected in response to the word line distance of the regular cell 16 from which data is read. For example, when data is read out of the regular cell 16a having the word line distance La that is short, the reference cell 26a having a short reference word line distance is selected. The regular cell 16a and the reference cell 26a are then connected to the sensing amplifier 30. Similarly, when the regular cell 16b or 16c is read, the corresponding reference cell 26b or 26c is selected and connected to the sensing amplifier 30.

It is therefore possible to set the reference word line distance of, for example, the reference cell 26a in such a manner that a delay time in the output to the sensing amplifier 30 from the reference cell 26a is equivalent to an average delay time in the outputs to the sensing amplifier 30 from the regular cells 16a in the sub-sector 11a. Thus, in accordance with the present invention, it is possible to select the reference cell 26 in response to the word line distance of the regular cell 16 in order for the delay time from the regular cell 16 to the sensing amplifier 30 to correspond to that from the reference cell 26 to the sensing amplifier 30.

In addition, the delay time from the reference cell 26a to the sensing amplifier 30 is set to the average delay time from the regular cells 16a in the sub-sector 11a to the sensing amplifier 30a. For example, it is possible to set the reference word line distance of the reference cell 26a to be the average word line distance of the regular cells 16a in the sub-sector 11a.

It is also possible to set the reference word line distances of the reference cells 26b and 26c in a similar manner.

As described heretofore, one reference cell 26 is selected from the multiple reference cells 26 having different reference word line distances in response to the word line distance of the regular cell 16 from which the data is read. Then, the regular cell 16 from which the data is read and such selected reference cell 26 are connected to the sensing amplifier 30. This makes it possible to reduce the difference in delay time in the outputs to the sensing amplifier 30 from the regular cell 16 and the reference cell 26. Thus, the operation margin of the sensing amplifier 30 can be ensured and it is possible to provide a semiconductor device in which the chip area can be reduced and the sensing operation can be accelerated.

Figure 4:
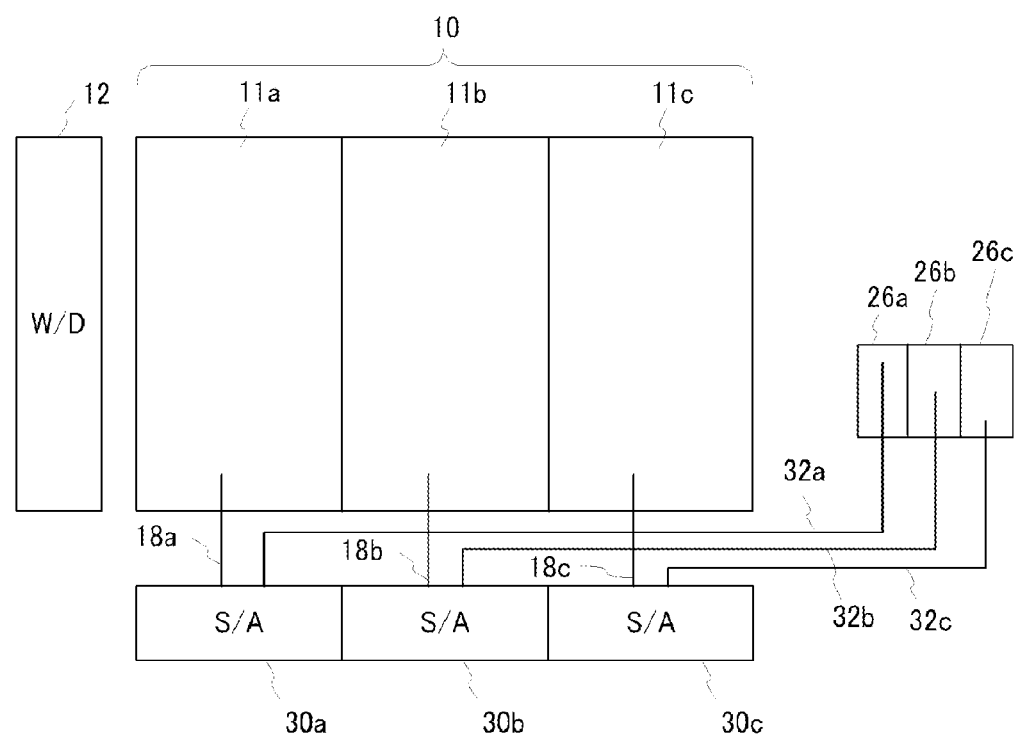
FIG. 4 is a block diagram of a regular sector and periphery thereof to illustrate a method of connecting the reference cells in the flash memory in accordance with the first embodiment of the present invention.

Next, a description will be given of a method of connecting the reference cells 26 in accordance with the first embodiment of the present invention. FIG. 4 is a block diagram of the regular sector and periphery thereof to illustrate the method of connecting the reference cell 26 in accordance with this first embodiment. Hereinafter, in FIG. 4, the word line 14, the regular cells 16, the reference word driver 22, and the reference sector 20 have the same configurations as those shown in FIG. 2, and, therefore, are omitted. The regular sector 10 is divided into the sub-sectors 11a, 11b, and 11c. The regular cells 16a, 16b, and 16c (not shown) in the sub-sectors 11a, 11b, and 11c are respectively connected to the sensing amplifiers 30a, 30b, and 30c via the bit lines 18a, 18b, and 18c. The sensing amplifiers 30a, 30b, and 30c are respectively connected to the reference cells 26a, 26b, and 26c via the connection lines 32a, 32b, and 32c.

As stated, there are provided multiple sub-sectors 11a, 11b, and 11c that divide the regular sector 10 according to the word line distance of the regular cell 16. The sensing amplifiers 30a, 30b, and 30c are respectively connected to the regular cells 16 in the sub-sectors 11a, 11b, and 11c, and are physically connected to the reference cells 26a, 26b, and 26c via the connection lines 32a, 32b, and 32c respectively. In this manner, the regular cell 16 from which the data is read and the reference cell 26 that has been selected can be connected to the sensing amplifier 30 in accordance with the present invention.

Figure 5:
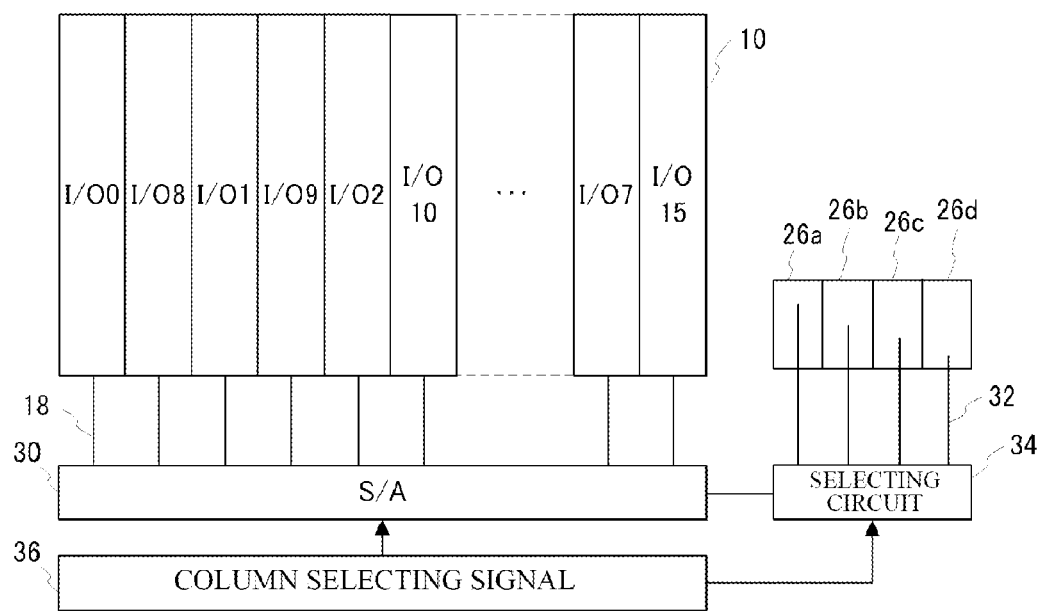
FIG. 5 is a block diagram of the regular sector and periphery thereof to illustrate an alternate method of connecting the reference cells in the flash memory in accordance with a variation example of the first embodiment of the present invention.

As a variation example of the first embodiment of the present invention, a description will be given of a flash memory having an alternate method of connecting the reference cells 26. FIG. 5 is a block diagram of the regular sector and periphery thereof to illustrate a method of connecting the reference cells 26 in the flash memory in accordance with a variation example of the first embodiment of the present invention. Hereinafter, in the present variation example of the first embodiment, the word driver 12, the word lines 14, the regular cells 16, the reference word driver 22, and the reference sector 20 have the same configurations as those employed in the first embodiment and, consequently, are not depicted.

The regular sector 10 is segmented by a unit of bit length in the output. In FIG. 5, the regular sector 10 is segmented into I/O 0 through I/O 15 by every sixteen bits. A selecting circuit 34 that selects the reference cell 26 is provided between the sensing amplifier 30 and the reference cells 26a, 26b, 26c, and 26d. A column selecting signal 36 is input into the sensing amplifier 30 and into the selecting circuit 34.

When data is read from the regular cells 16 in the I/O0, I/O8, I/O1, and I/O9 having word line distances that are short, the column selecting signal 36 is input into the sensing amplifier 30, and the regular cells in the afore-mentioned I/Os are selected. The column selecting signal 36 is also input into the selecting circuit 34 to select the reference cell 26a having the reference word line distance that is short to connect such selected reference cell 26a to the sensing amplifier 30. Data is read from the regular cells in other I/Os in a similar manner, so that the reference cell 26 that corresponds to the word line distance of the regular cell 16 in the regular sector 10 can be selected and connected to the sensing amplifier 30. As described heretofore, the selecting circuit 34 has capabilities of selecting one of the reference cells 26 in response to the word line distance of the regular cell 16 and connecting such selected reference cell 26 to the sensing amplifier 30.

Also in this variation example of the first embodiment of the present invention, the regular cell 16 from which the data is read and the reference cell 26 that has been selected can be connected to the sensing amplifier 30.

In this variation example of the first embodiment, multiple connection lines 32 are not necessary, although they are employed in the first embodiment. However, the selecting circuit 34 is necessary. Thus, it is possible to determine which configuration to employ by considering the chip area necessary for the multiple connection lines 32 and that necessary for the selecting circuit 34.

In accordance with the first embodiment and the variation example thereof, three reference cells 26 and four reference cells 26 are used as examples; one skilled in the art, however, will quickly realize that multiple reference cells 26 are capable of bringing about the same effect. As the number of reference cells 26 is increased, it is possible to reduce the difference in the delay time from the regular cell 16 to the sensing amplifier 30 and from the reference cell 26 to the sensing amplifier 30. This, however, enlarges the area occupied by the reference sector 20 or that occupied by the selecting circuit 30. The number of the reference cells 26, therefore, should be determined in consideration of the afore-mentioned factors.

Second Embodiment

In accordance with a second embodiment of the present invention, a description will be given of a flash memory having a regular cell 16 that stores multiple bits as multiple binary values (e.g., two bits as four binary values). In accordance with this second embodiment, the transistor used for the regular cell 16 and the reference cell 26 while capable of storing multiple bits per cell is depicted as that of the first embodiment. Two bits can be stored by dividing the charge amount stored in the floating gate 55 into four states. "0" represents a state where a bit stores a charge. "1" represents a state where a bit does not store a charge. Accordingly, four binary values of (00), (01), (10), and (11) can be stored in a single cell.

Figure 6:
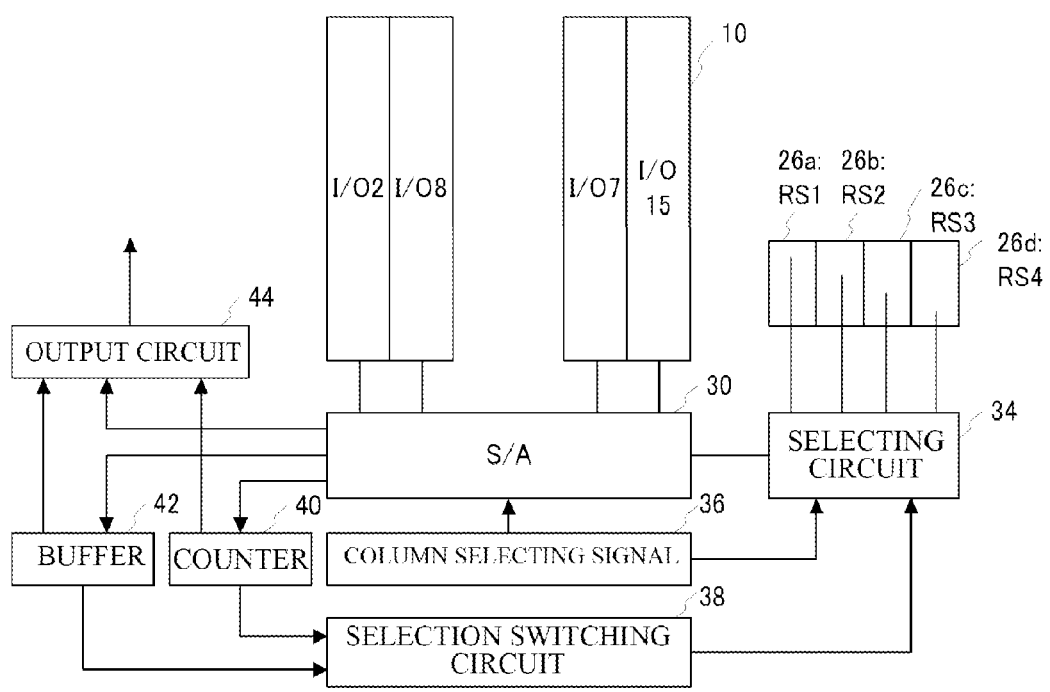
FIG. 6 is a block diagram illustrating a memory cell and periphery thereof in the flash memory in accordance with a second embodiment of the present invention.

FIG. 6 is a block diagram illustrating a memory cell and periphery thereof in a flash memory in accordance with the second embodiment of the present invention. Hereinafter, in the second embodiment, the word driver 12, the word line 14, the regular cells 16, the reference word driver 22, and the reference word line 24 have the same configurations as those described in accordance with the first embodiment and, accordingly, are not shown. Also, in the same manner as the variation example of the first embodiment, the regular sector 10 is segmented into I/O 0 through I/O 15 by a unit of the bit length in the output. For example, when the data is read from the regular cells 16 in the I/O 0, I/O 8, I/O 1, and I/O 9 having the word line distances that are short, the selecting circuit 34 selects the regular cell 16 in the I/O and the reference cell 26 and connects such selected regular cell 16 and the reference cell 26 to the sensing amplifier 30 by use of the column selecting signal 36. In addition, there is provided a selection switching circuit 38, a counter 40, a buffer 42, and an output circuit 44. In the same manner as the variation example of the first embodiment, one of the reference cells 26 is selected, by the use of the column selecting signal 36, in response to the word line distance of the regular cell 16 from which the selecting circuit 34 reads the data.

Figure 7:
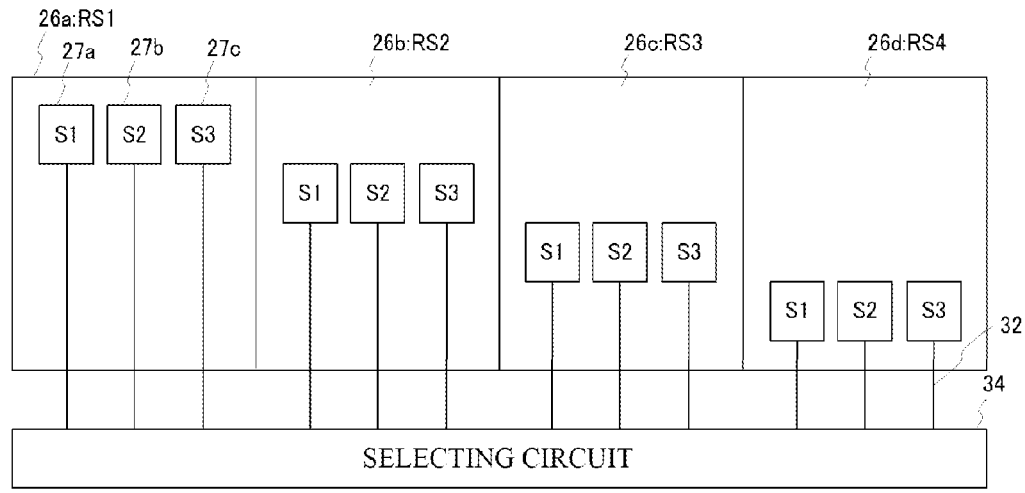
FIG. 7 is a view illustrating a selecting circuit and the reference cells in the flash memory in accordance with the second embodiment of the present invention.

FIG. 7 is a view illustrating the selecting circuit 34 and the reference cells 26 in accordance with the second embodiment of the present invention. The reference word driver 22 and the reference word line 24 are not shown. A reference cell RS1 (26a) that corresponds to the regular cell having a word line distance that is short includes multiple sub-reference cells S1 (27a), S2 (27b), and S3 (27c). Similarly, the reference cells RS2 (26b), RS3 (26c), and RS4 (26d) each have multiple sub-reference cells S1, S2, and S3. The sub-reference cells S1 (27a), S2 (27b), and S3 (27c) are connected to the selecting circuit 34. During operation, the selecting circuit 34 selects one of the sub-reference cells S1, S2, and S3 in the reference cells RS1, RS2, RS3, and RS4 and connects such selected sub-reference cell to the sensing amplifier 30.

Figure 8:
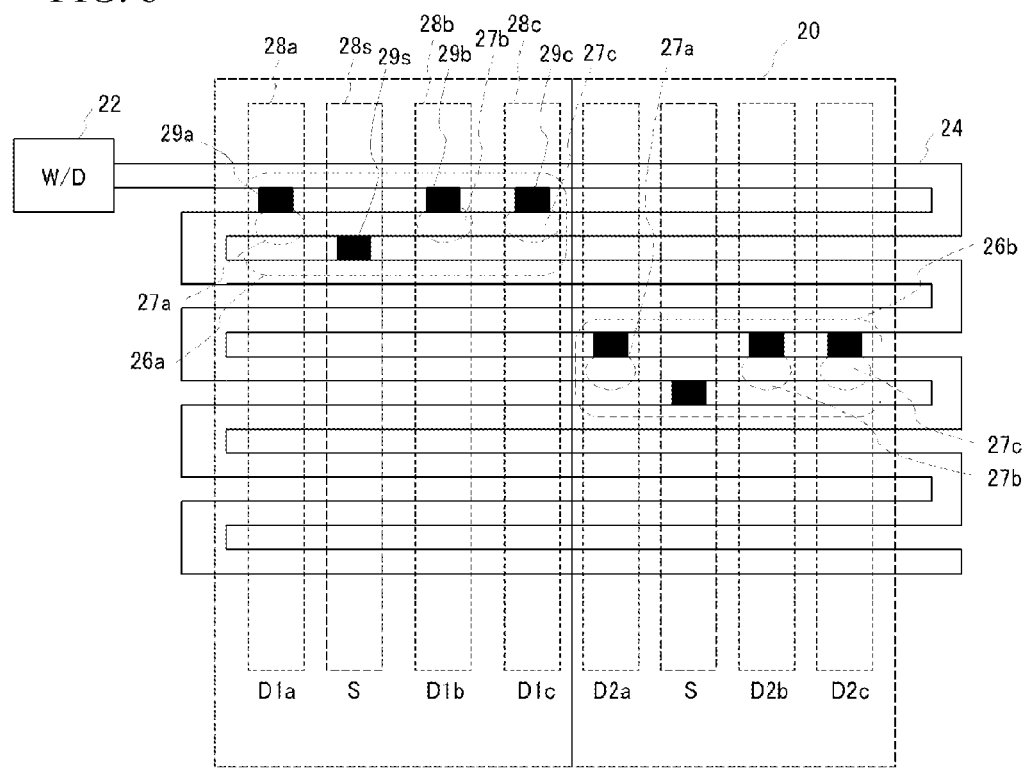
FIG. 8 is a view illustrating the reference sector in the flash memory in accordance with the second embodiment of the present invention.

FIG. 8 is a view illustrating the reference sector 20 in accordance with the second embodiment of the present invention. The reference cells RS3 (26c) and RS4 (26d) are omitted. The reference word line 24 connected to the reference word driver 22 has a rectangular waved shape and is connected to the reference cells RS1 (26a) and RS2 (26b). Multiple sub-reference cells S1 (27a), S2 (27b), and S3 (27c) associated with an identical reference cell RS1 (26a) are adjacently disposed one to another and connected to the reference word line 24 as illustrated such that the adjacently disposed sub-reference cells have equivalent reference word line distances.

The drain and source regions of the sub-reference cell S1 (27a) are connected by the connection regions D1a (28a) and S (28s) via contact portions 29a and 29s, respectively. Similarly, the sub-reference cell S2 (27b) is respectively connected by the connection regions D1b (28b) and S (28s) via contact portions 29b and 29s, and sub-reference cell S3 (27c) is respectively connected by the connection regions D1c (28c) and S (28s) via contact portions 29c and 29s.

The same configuration is provided for the sub-reference cells S1 (27a), S2 (27b), and S3 (27c) of the reference cell RS2 (26b) wherein the reference cell 26b has a reference word line distance longer than that of the reference cell 26a.

In accordance with a method of reading multi-bit data from the regular cell 16 in the regular sector 10, the three sub-reference cells S1, S2, and S3 are used for reading the four binary values. The sub-reference cell S1 is first used to determine whether the regular cell 16 represents a binary state of "0×" or "1×". If the regular cell 16 represents "0×", S2 is then used to determine whether the regular cell 16 represents (00) or (01). If the regular cell 16 represents "1×", S3 is then used to determine whether the regular cell 16 represents (10) or (11).

In regards to the method of selecting the sub-reference cell in accordance with this second embodiment of the present invention, when the address is designated and reading of data begins, the selecting circuit 34 selects the reference cell 26 by use of the column selecting signal 36 in response to the word line distance of the regular cell 16 in the regular sector 10 from which the data is read. Suppose that the reference cell RS1 (26a) is selected. At first, the selecting circuit 34 selects the sub-reference cell S1. If the data read is "0", then "0" is the value of the left bit and is input into the buffer 42 (FIG. 6). At the same time, "1" is input into the counter 40 (FIG. 6), which is counting how many times the data is read.

Then, if "0" is output from the buffer 42 and "1" is output from the counter 40, the sub-reference cell S2 (27b) is selected from the reference cell RS1 (26a) by means of a signal provided from the selection switching circuit 38. The regular cell 16 and the sub-reference cell S2 (27b) are then connected to the sensing amplifier 30 which determines whether a right bit represents "0" or "1". When the result is output from the sensing amplifier 30, "2" is input into the counter 40 and the output from the sensing amplifier 30 is input into both the buffer 42 and the output circuit 44. In response to the counter 40 outputting a signal into the output circuit 44, the output circuit 44 outputs "0" as a left bit from the buffer 42 and "0" or "1" as a right bit from the sensing amplifier 30. Thus, "00" or "01" is output from the output circuit 44.

On the other hand, if "1" is output from the buffer 42 and "1" is output from counter 40 in response to the initial reading of the left bit, the sub-reference cell S3 (27*c*) is selected from the reference cell RS1 (26*a*) by means of a signal applied from the selection switching circuit 38. The regular cell 16 and the sub-reference cell S3 (27*c*) are then connected to the sensing amplifier 30 and the sensing amplifier 30 determines whether the right bit represents "0" or "1". When the result is output from the sensing amplifier 30, "2" is input into the counter 40 and the output from the sensing amplifier 30 is input into both the buffer 42 and output circuit 44. In response to the counter 40 outputting a signal into the output circuit 44, the output circuit 44 outputs "1" as a left bit from the buffer 42 and "0" or "1" as a right bit from the sensing amplifier 30. Therefore, "10" or "11" outputs from the output circuit 44.

Thus, the output circuit 44 outputs any of (00), (01), (10), and (11) in response to the output from the counter 40 being "2" and in accordance with the output from the buffer 42 and that from the sensing amplifier 30.

In the regular cell 16 where multi-bit data is stored, as described in this second embodiment of the present invention, multiple sub-reference cells 27 are needed. For example, the cell that stores four binary values requires three sub-reference cells 27. As previously stated, multiple sub-reference cells 27*a* (S1), 27*b* (S2), and 27*c* (S3) associated with an identical reference cell 26 substantially have the same reference word line distances. This results in delay times that are substantially equivalent in the outputs from the sub-reference cells 27 to the sensing amplifier 30.

Delay times that are substantially equivalent denotes that the difference in delay times is extremely small in the distribution of delay times for outputs to the sensing amplifier 30 from the regular cells 16 associated with a single reference cell 26. Concerning the operation margin of the sensing amplifier 30, this eliminates the necessity of considering a difference in delay times of outputs from the sub-reference cells 27 associated with a single reference cell 26. Accordingly, the operation margin during the sensing operation can be assured.

In addition, by selecting one of the reference cells 26 to correspond to the word line distance of the regular cell 16, it is possible to decrease the delay time in the output to the sensing amplifier 30 from the sub-reference cells 27 in such selected reference cell 26 while decreasing the difference of delay times in the outputs to the sensing amplifier 30 from the regular cells 16. It is therefore possible to provide a semiconductor device where the chip area can be further reduced and the sensing operation can be speeded up.

There is a need of reading data with subtle differences in the threshold voltages of the regular cells 16 for flash memory devices provided with regular cells 16 in the regular sector 10, wherein each of the regular cells 16 stores multi-bit data. For this reason, if there is a distinct difference between delay times in outputs to the sensing amplifier 30 from the regular cell 16 and from the reference cell 26, the sensing amplifier 30 will operate unstably. Unstable operation hinders further miniaturization and acceleration of operations performed thereby, thus employing the present invention facilitates further miniaturization of flash memory devices and stable, accelerated operation thereof, enabling large increases in storage capacity of flash memories and other advantages.

Figure 9:
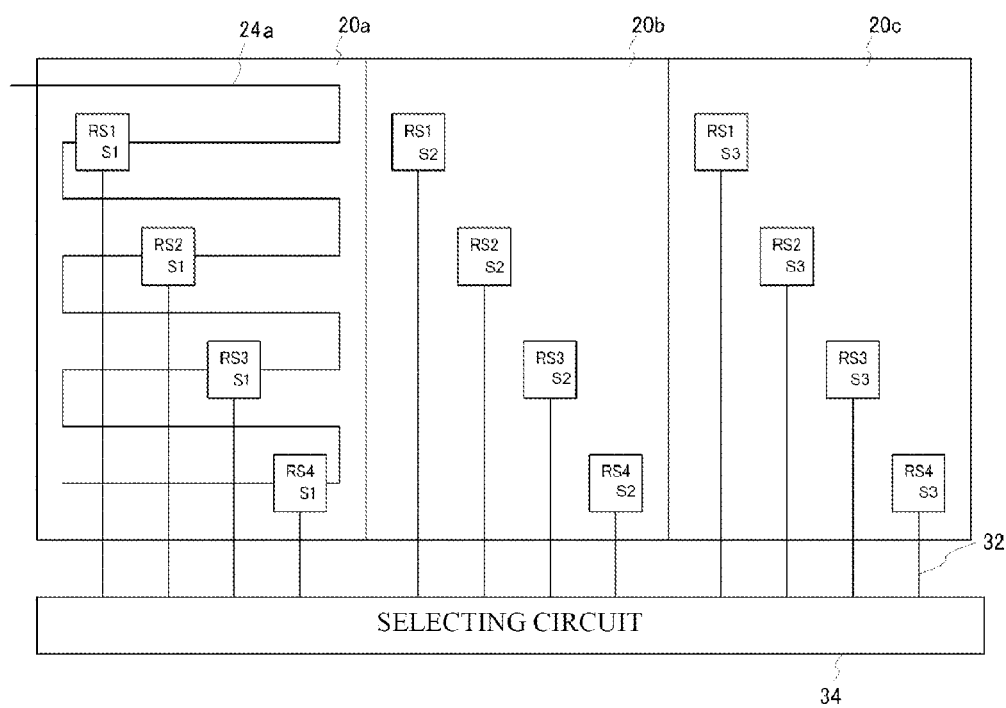
FIG. 9 shows the reference sector, the selecting circuit, and periphery thereof in the flash memory in accordance with a variation example of the second embodiment.

FIG. 9 shows the reference sector 20, the selecting circuit 34, and periphery thereof in the flash memory in accordance with a variation example of the second embodiment of the present invention. Except for the reference sector 20, this variation example of the second embodiment employs the same components and configurations as those of the second embodiment. Within reference sector 20, there are provided reference sectors 20*a*, 20*b*, and 20*c*. Reference sector 20*a* includes the sub-reference cells S1 of the reference cells RS1, RS2, RS3, and RS4.

The respective sub-reference cells S1 are connected to an identical reference word line 24*a*. Similarly, the reference sectors 20*b* and 20*c* are also provided with the sub-reference cells S2 and S3, respectively, and are respectively connected to different reference word lines (not shown).

Multiple sub-reference cells S1, S2, and S3 associated with a single reference cell RS1 are configured to have reference word line distances that are substantially equivalent. Similarly, multiple sub-reference cells S1, S2, and S3 respectively associated with identical reference cells RS2, RS3, and RS4 are configured to have reference word line distances that are substantially equivalent.

In accordance with this variation example of the second embodiment, multiple sub-reference cells 27 associated with an identical reference cell 16 may be provided in different reference sectors 20 and be connected to different reference word lines 24. Also in this variation, it is possible to bring about the same effects as those of the second embodiment. In accordance with the second embodiment and in accordance with this variation example of the second embodiment, four binary values are exemplified as multi-bit data. However, multi-bit data comprising binary values other than four binary values may also be employed.

Third Embodiment

Figure 10:
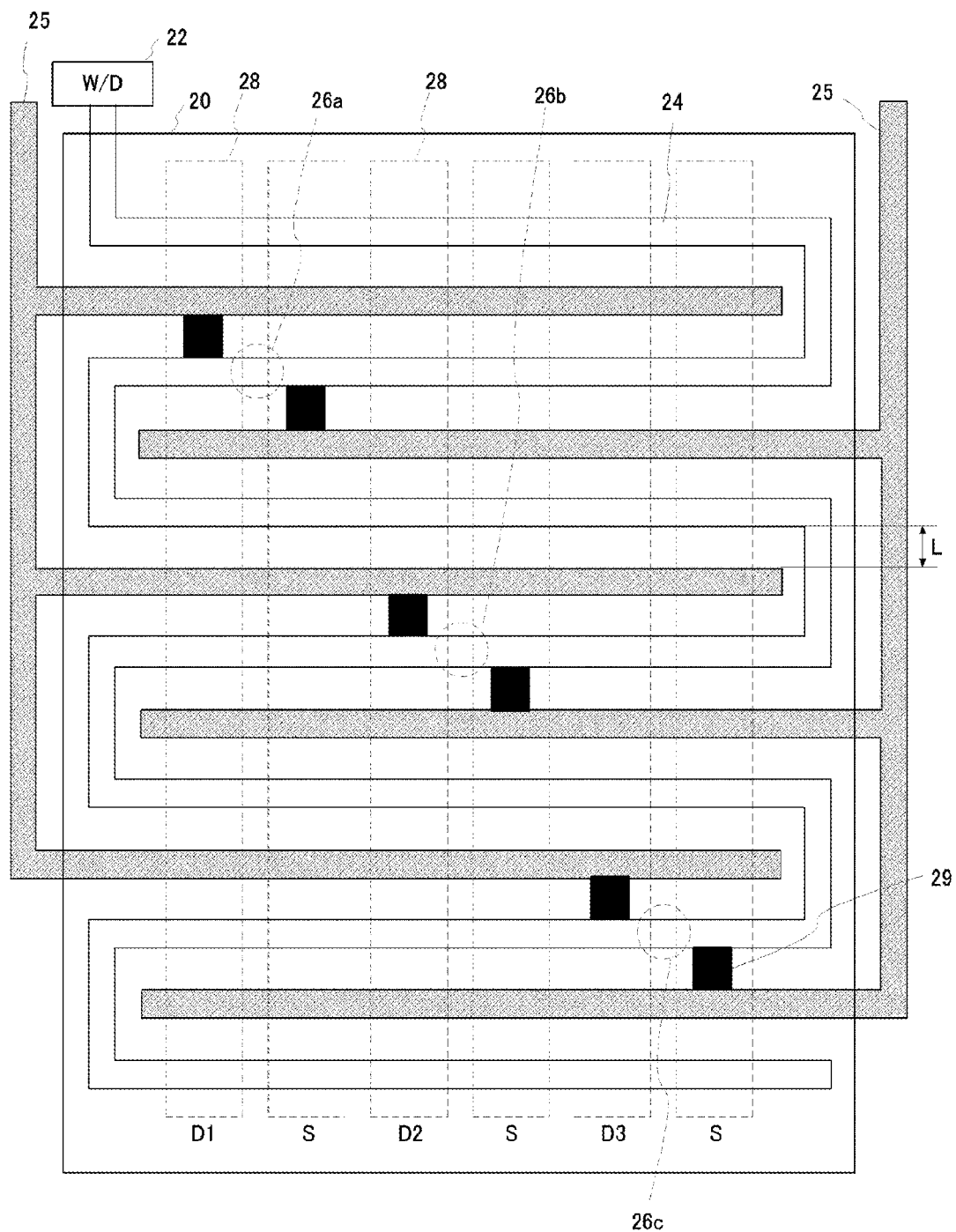
FIG. 10 shows the reference sector in the flash memory in accordance with a third embodiment of the present invention.

In accordance with a third embodiment of the present invention, the reference sector 20 is provided with a dummy word line 25. FIG. 10 depicts the reference sector in a flash memory in accordance with the third embodiment of the present invention. Hereinafter, except for a dummy word line 25, a flash memory in accordance with the third embodiment employs the same components and configurations as those shown in FIG. 2(*b*) and described in accordance with the first embodiment of the present invention. Accordingly, there is provided the word driver 12 and the regular cell 16 disposed in the regular sector 10 and connected to the word line 14 as depicted in FIG. 2(*b*). Referring to FIG. 10, the reference sector 20 includes the reference word line 24 having a rectangular waved shape and connected to the reference cells 26. In addition, the dummy word line 25 is adjacently arranged to the reference word line 24.

As the memory cell is further downsized, spacing between the word lines 14 is narrower in the regular sector 10. This increases the capacitance between the adjacently arranged word lines 14 and affects the delay time in output to the sensing amplifier 30 from the regular cell 16. However, the reference word line 24 in accordance with the first embodiment of the present invention does not contemplate adjacent word line related parasitic capacitor. Accordingly, even if it is configured such that the word line distance of the regular cell 16 connected to the sensing amplifier 30 is substantially equivalent to the reference word line distance of the reference cell 26, there will nevertheless be a difference in the delay time between outputs to the sensing amplifier 30 from the regular cell 16 and the reference cell 26.

To compensate for this delay, the dummy word line 25 is provided so as to create a parasitic capacitance between the dummy word line 25 and the reference word line 24 corresponding to that between the adjacently arranged word lines 14. In this manner, the capacitance applied to the reference word line 24 approximates that of the word line 14, thereby decreasing the difference between the delay times of the output from the regular cell 16 to the sensing amplifier 30 and from the reference cell 26 to the sensing amplifier 30, thereby making it possible to provide a semiconductor device where the chip area can be reduced and the sensing operation can be speeded up.

Preferably, the dummy word line 25 is connected to a fixed voltage. This allows the capacitance applied to the reference word line 24 to further approximate the capacitance of the word line 14, further decreasing the difference between the delay times from the regular cell 16 to the sensing amplifier 30 and from the reference cell 26 to the sensing amplifier 30.

Preferably, the spacing between the reference word line 24 and the dummy word line 25 is configured to be substantially equal to the spacing between adjacent word lines 14 in the sector. This enables the capacitance applied to the reference word line 24 to be substantially equal to that between word lines 14, further reducing the difference between the delay times.

It is also possible to provide the dummy word line 25 in a case where there is one reference cell 26, in addition to a case where multiple reference cells 26 are provided, thereby decreasing the difference between the delay times from the regular cell 16 to the sensing amplifier 30 and from the reference cell 26 to the sensing amplifier 30 in flash memory devices utilizing multiple reference cells 26.

Fourth Embodiment

Figure 11:
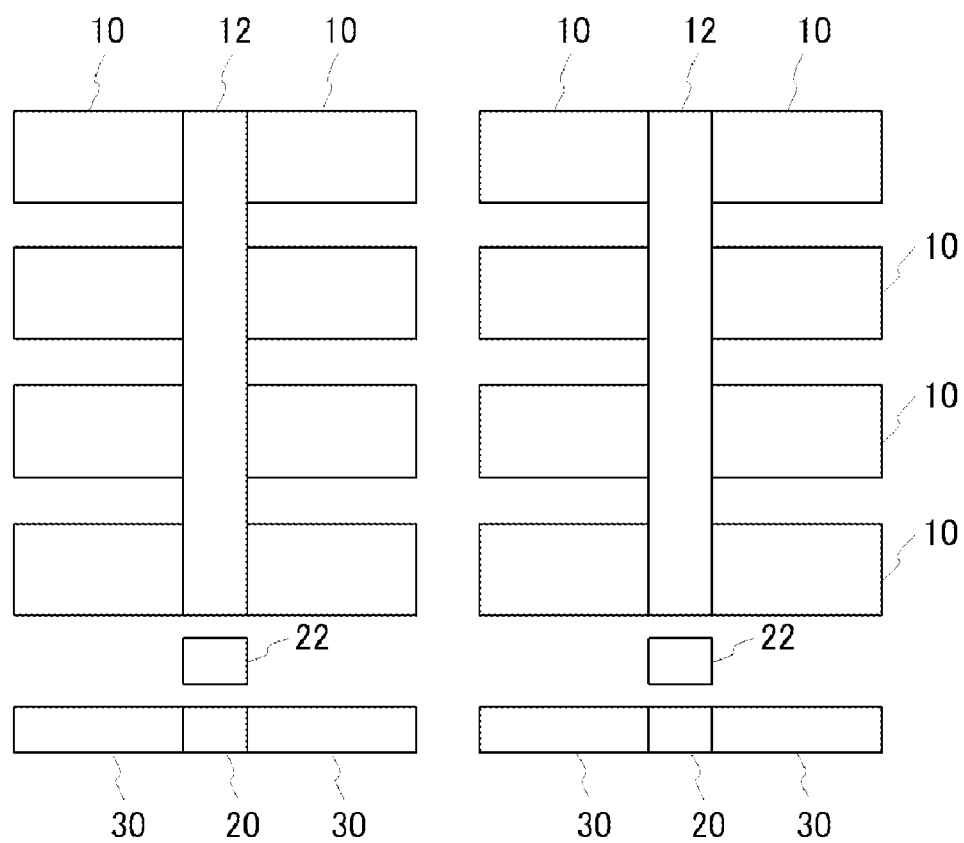
FIG. 11 shows an arrangement in the flash memory in accordance with a fourth embodiment of the present invention.

In accordance with a fourth embodiment of the present invention, the reference sector 20 and the reference word driver 22 are adjacently arranged to the word driver 12. FIG. 11 shows an arrangement in a flash memory in accordance with the fourth embodiment of the present invention. Multiple regular sectors are disposed on both sides of the word driver 12, and corresponding sensing amplifiers 30 are situated below the multiple regular sectors 10 in the drawing. The reference word driver 22 is adjacent to the word driver 12.

This enables both the reference word driver 22 and the word driver 12 to be disposed near a booster circuit which, accordingly, provides outputs to the regular cell 16 and to the reference cell 26 at practically the same timings. Thus, it is possible to further decrease the difference between the delay times from the regular cell 16 to the sensing amplifier 30 and from the reference cell 26 to the sensing amplifier 30.

Furthermore, the reference word driver 22 is arranged adjacent to the sensing amplifier 30 side of the word driver 12 and the reference sector 20 is arranged adjacent to the sensing amplifiers 30 and the reference word driver 22. This arrangement provides less degradation of the output from the reference cell in the reference sector 20 to the sensing amplifier 30, and improves the sensing accuracy of the sensing amplifier 30.

In a flash memory, the sensing amplifier 30 implements the sensing operation by comparing the current flowing across the regular cell 16 and that flowing across the reference cell 26. That is the reason there is less delay time in the output caused by the resistance or capacitance of the wiring from the sensing amplifier 30 to the cell or the reference cell, but there is more delay time in the output caused by the word line distance. Therefore, in the embodiments described heretofore, the effects of the present invention are obtainable by employing the present invention for a case where the regular cells 16 and the reference cells 26 are flash memory cells.

While, in accordance with the first through fourth embodiments, flash memories are exemplified, the effects of the present invention may be produced by employing the present invention for any semiconductor device where a sensing operation is carried out by comparing a current flowing across a regular cell 16 and that flowing across a reference cell 26. Thus, in accordance with the present invention, a semiconductor device may be provided where it is possible to reduce a difference between delay times of outputs to a sensing amplifier from regular cells and from reference cells, thereby reducing a chip area and accelerating a sensing operation thereof.

Although a few preferred embodiments of the present invention have been shown and described, it would be appreciated by those skilled in the art that changes may be made in these embodiments without departing from the principles and spirit of the invention, the scope of which is defined in the claims below and their equivalents.

The invention claimed is:

1. A semiconductor device comprising:
   regular cells disposed in a regular sector and connected to a word line;
   a plurality of reference cells used in reading data from the regular cells;
   a reference word line connected to the plurality of reference cells; and
   a dummy word line located along the reference word line, wherein one of the reference cells is selected in response to a word line distance associated with a regular cell from which data is read.

2. The semiconductor device as claimed in claim 1, wherein each of the plurality of reference cells has a different reference word line distance from each other.

3. A semiconductor device comprising:
   regular cells disposed in a regular sector and connected to a word line;
   sub-sectors of the regular cells;
   a plurality of reference cells used in reading data from the regular cells,
   wherein one of the reference cells is selected in response to a word line distance associated with a regular cell from which data is read,
      the semiconductor device further comprising sensing amplifiers connected to the regular cells from which data is read and ones of the plurality of reference cells selected, the sensing amplifiers connected to the regular cells in each of the sub-sectors connected to the same reference cell.

4. The semiconductor device as claimed in claim 3, further comprising a selecting circuit selecting the reference cell in response to the word line distance and connected to the sensing amplifier.

5. The semiconductor device as claimed in claim 3, further comprising:
   a reference word driver driving the reference word line; and
   a word driver driving the word line, wherein the reference word driver is adjacent to the word driver.

6. A semiconductor device comprising:
regular cells disposed in a regular sector and connected to a word line, wherein the regular cells are multi-bit cells;
a plurality of reference cells used in reading data from the regular cells; and
a reference word line connected to the reference cells,
wherein each of the reference cells has a different reference word line distance from each other and each of the reference cells has a plurality of sub-reference cells, and wherein one of the reference cells is selected in response to a word line distance associated with a regular cell from which data is read.

7. The semiconductor device as claimed in claim 6, wherein the sub-reference cells associated with an identical reference cell are connected to an identical reference word line.

8. The semiconductor device as claimed in claim 6, wherein each of the sub-reference cells is connected to a different reference word line.

9. The semiconductor device as claimed in claim 1, wherein the regular cells are flash memory cells.

10. The semiconductor device as claimed in claim 1, wherein the dummy word line is connected to a constant voltage source.

11. The semiconductor device as claimed in claim 1, wherein spacing between the reference word line and the dummy word line is substantially equal to that between adjacent word lines in the regular sector.

12. The semiconductor device as claimed in claim 1 further comprising:
sub-sectors of the regular cells; and
sensing amplifiers connected to the regular cells from which data is read and ones of the plurality of reference cells selected, the sensing amplifiers connected to the regular cells in each of the sub-sectors connected to the same reference cell.

13. The semiconductor device as claimed in claim 12, further comprising a selecting circuit selecting the reference cell in response to the word line distance and connected to the sensing amplifier.

14. The semiconductor device as claimed in claim 12, further comprising:
a reference word driver driving the reference word line; and
a word driver driving the word line,
wherein the reference word driver is adjacent to the word driver.

15. The semiconductor device as claimed in claim 3, wherein the regular cells are flash memory cells.

16. The semiconductor device as claimed in claim 6, wherein the regular cells are flash memory cells.

17. The semiconductor device as claimed in claim 6, further comprising:
sub-sectors of the regular cells; and
sensing amplifiers connected to the regular cells from which data is read and ones of the plurality of reference cells selected, the sensing amplifiers connected to the regular cells in each of the sub-sectors connected to the same reference cell.

18. The semiconductor device as claimed in claim 17, further comprising a selecting circuit selecting the reference cell in response to the word line distance and connected to the sensing amplifier.

19. The semiconductor device as claimed in claim 17, further comprising:
a reference word driver driving the reference word line; and
a word driver driving the word line,
wherein the reference word driver is adjacent to the word driver.

* * * * *